United States Patent

Donners

(10) Patent No.: US 6,731,124 B2
(45) Date of Patent: May 4, 2004

(54) INTEGRATED DEVICE FOR TESTING CONTACTS

(75) Inventor: Maurice Alexander Hugo Donners, Eindhoven (NL)

(73) Assignee: Koninklijke Philips Electronics N.V, Eindhoven (NL)

( * ) Notice: Subject to any disclaimer, the term of this patent is extended or adjusted under 35 U.S.C. 154(b) by 27 days.

(21) Appl. No.: 09/965,453

(22) Filed: Sep. 27, 2001

(65) Prior Publication Data

US 2002/0075029 A1 Jun. 20, 2002

(30) Foreign Application Priority Data

Sep. 28, 2000 (EP) .............................. 00203363

(51) Int. Cl.$^7$ .............................................. G01R 31/02
(52) U.S. Cl. ...................................................... 324/756
(58) Field of Search ................................. 324/756, 605, 324/765, 767, 522, 537, 719; 438/14, 17, 18; 73/432.1

(56) References Cited

U.S. PATENT DOCUMENTS

| | | |
|---|---|---|
| 3,624,496 A | 11/1971 | Feinstein et al. |
| 4,587,481 A | 5/1986 | Lischke et al. ................ 324/73 |
| 4,725,773 A * | 2/1988 | Lieneweg .................. 324/73 R |
| 4,752,118 A * | 6/1988 | Johnson ...................... 350/334 |
| 5,962,868 A | 10/1999 | Tanida .......................... 257/48 |
| 6,100,710 A * | 8/2000 | Monnot ....................... 324/765 |

FOREIGN PATENT DOCUMENTS

DE 2828551 A1 3/1980 ........... G08B/29/00

* cited by examiner

Primary Examiner—N. Le
Assistant Examiner—Amy He
(74) Attorney, Agent, or Firm—Steven R. Biren

(57) ABSTRACT

The invention relates to a device (10) for testing a series of contacts (Cij), which are provided with connection conductors (G, H) for supplying electric current to the contacts (Cij). The known device is less suitable for testing large numbers of contacts (Cij), at least because it is expensive and the testing operation is tedious. A device (10) according to the invention includes a (semiconductor) body (1) on which the contacts (Cij) are present in the form of an array (A), connection conductors (G, H) which are provided with a selection device. (S) enabling maximally two contacts (C11, C11') to be selected, the connection conductors (G, H) being formed within maximally two separate metal layers (2, 3). Such a device (10) is inexpensive and easy to manufacture, and it also enables a large number of contacts (Cij) to be (semi-) quantitatively tested at a high speed. In one embodiment, the selection devices (S) are formed by diodes (D) in a matrix of a limited number of connection conductors (G, H), enabling only one pair of contacts (C11, C11') to be tested. In another embodiment, the selection means (S) are formed by series-connected capacitors Zij and inductors Lij, enabling each contact (C11) to be individually tested within a network N.

7 Claims, 3 Drawing Sheets

INTEGRATED DEVICE FOR TESTING CONTACTS

BACKGROUND OF THE INVENTION

The invention relates to a device for testing a series of contacts, which are provided with connection conductors for supplying an electric current to said contacts. Such a device can suitably be used to supply information regarding the reliability of contacts. The properties of the contacts, such as the impedance, can be examined in dependence upon various parameters, such as temperature, humidity, the material from which they are made and the way in which they are made. In order to form an accurate idea of said properties, it is necessary to test large numbers of contacts.

A device of the type mentioned in the opening paragraph is known from United States patent specification U.S. Pat. No. 3,624,496, published on Nov. 30, 1971. In said document, a description is given of a device wherein each one of the contacts to be tested is provided with two connection conductors. This enables the contact to be quantitatively tested in a simple manner.

A drawback of the known device resides in that testing a large number of contacts requires either a large number of devices to be made or a device to be provided with a large number of connection conductors, causing this device to be very complex and expensive.

SUMMARY OF THE INVENTION

Therefore, it is an object of the invention to provide a device by means of which a large number of contacts can be tested quantitatively, or at least semi-quantitatively, and which is neither complex nor expensive.

To achieve this, a device of the type mentioned in the opening paragraph is characterized in accordance with the invention in that the device comprises a body on which the contacts are situated in the form of an array, and the connection conductors are provided with selection means enabling the selection of maximally two contacts, and the connection conductors are formed in maximally two separate metal layers.

The invention is based on the recognition that the number of connection conductors for a large number of contacts can be substantially reduced in various ways. In the first place, it is possible to couple all contacts, in a matrix-like manner, to two groups of mutually parallel conductors, the conductors of one group extending (approximately) perpendicularly to the conductors of the other group. By coupling each time n contacts to a first conductor (of a first group of parallel conductors) and m contacts to a second conductor (of a second group of parallel conductors), n×m contacts are each provided with two connection conductors of a group of n connection conductors and a group of m connection conductors, respectively. By subsequently energizing a single conductor of one group and a single conductor of the other group, in principle, a single contact can be tested. However, part of the test current will also flow through other contacts via a (series of) circuit(s) formed in the matrix, which clouds the measurement. Such a circuit current can be precluded by incorporating selection means, in the form of a diode, in the device for testing the contact. This enables each pair of two contacts to be quantitatively measured and tested by means of a single selection. By virtue of the fact that the two groups of conductors are embodied in no more than two separate metal (conductor) layers, the device is not complex and can be readily manufactured. Diodes used as selection means can be very suitably integrated if the device comprises a semiconductor body. In this case, a contact is formed on each side of the rectifier junction formed by the diode, so that per selection only two contacts are measured/tested simultaneously. In this manner, a large number of contacts can be quantitatively tested with a (substantially) reduced number of connection conductors.

A preferred embodiment of a device in accordance with the invention is therefore characterized in that each contact is connected on one side to a first connection conductor and on the other side, via a neighboring contact, to a second connection conductor, the first and the second connection conductor being formed in, respectively, a first and a second metal layer and extending substantially perpendicularly to each other, and the selection means comprising diodes, formed in a semiconductor body, said diodes connecting each contact to the neighboring contact. This device can be readily manufactured in an inexpensive manner. Preferably, the two metal layers are situated on either side of a substrate on which the body is mounted, the first connection conductor being directly connected to the contact and the second connection conductor being connected to the neighboring contact by means of a via.

Another particularly advantageous embodiment is characterized in that each contact in a network is connected, on one side, to a first metal layer and, on the other side, in a second metal layer, to a series-arranged inductance and capacitance, the network being provided with no more than two connection conductors. The selection means are formed, in this case, by accommodating the contacts in a resonant circuit and coupling each contact to a selection element. In this manner, using only two connection conductors, each contact can be separately, and at least semi-quantitatively, measured and tested. The selection element is now formed by a series arrangement of a capacitor and a coil. The two connection conductors (and the other conductors) are formed, in this case, in no more than one metal layer. Only one additional metal layer situated on the (semiconductor) body completes the network. This device is very attractive because it is both simple and readily operable.

Preferably, the first metal layer is situated on the body attached to a substrate on which the second metal layer is situated in which the series-arranged inductance and capacitance are housed and in which the two connection conductors are formed. In a favorable embodiment of this modification, the first metal layer is situated on the body attached to a substrate, and the series-arranged inductance and capacitance are accommodated therein, and the second metal layer is situated on the substrate, and the two connection conductors are formed therein.

Preferably, the value of the product of each series-arranged inductance and capacitance for each contact differs at least 20% from the value of the product for any other contact. Thus, it is guaranteed in practice that there is no overlap between the measurements and tests to which any two contacts are subjected. Said difference allows a large number of contacts positioned in an array to be tested.

In all devices mentioned hereinabove, the contacts are preferably provided in the form of a two-dimensional array on the body. In this manner, a large number of contacts can be tested in a device which is as compact as possible. A contact which, in practice, is very attractive and important is formed by a soldered joint.

These and other aspects of the invention will be apparent from and elucidated with reference to the embodiment(s) described hereinafter.

BRIEF DESCRIPTION OF THE DRAWINGS

In the drawing.

The drawings are diagrammatic and not to scale; particularly the dimensions in the thickness direction being exaggerated for clarity. Corresponding areas bear the same reference numeral whenever possible.

DESCRIPTION OF THE PREFERRED EMBODIMENTS

Figure 1:
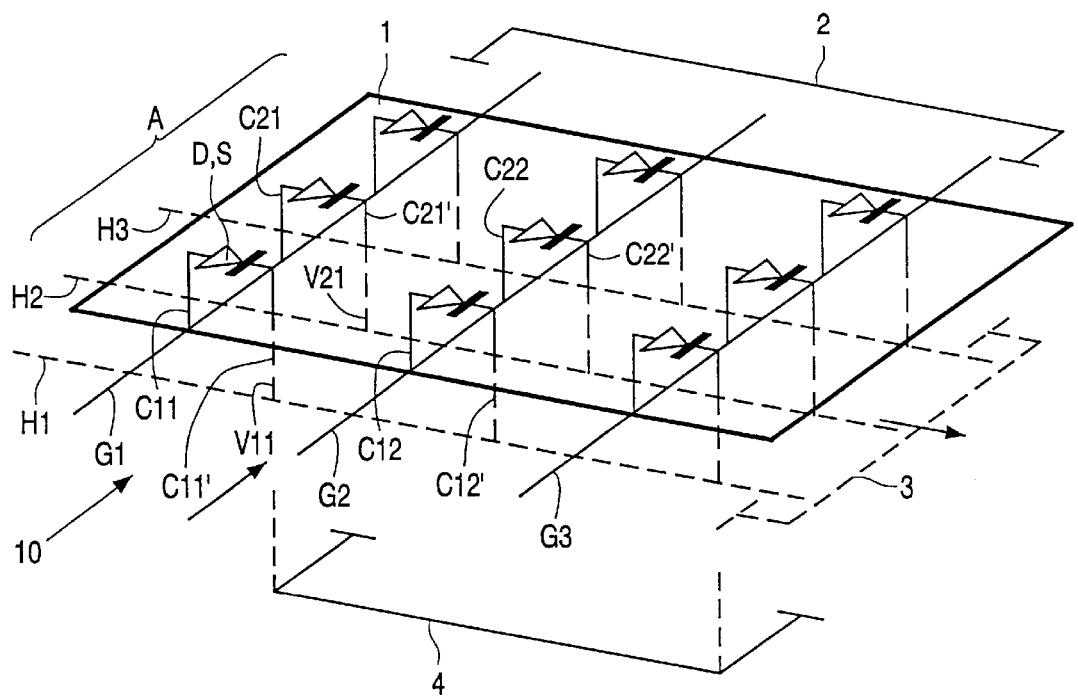
FIG. 1 is a diagrammatic, perspective view of a first example of a device in accordance with the invention.
Figure 2:
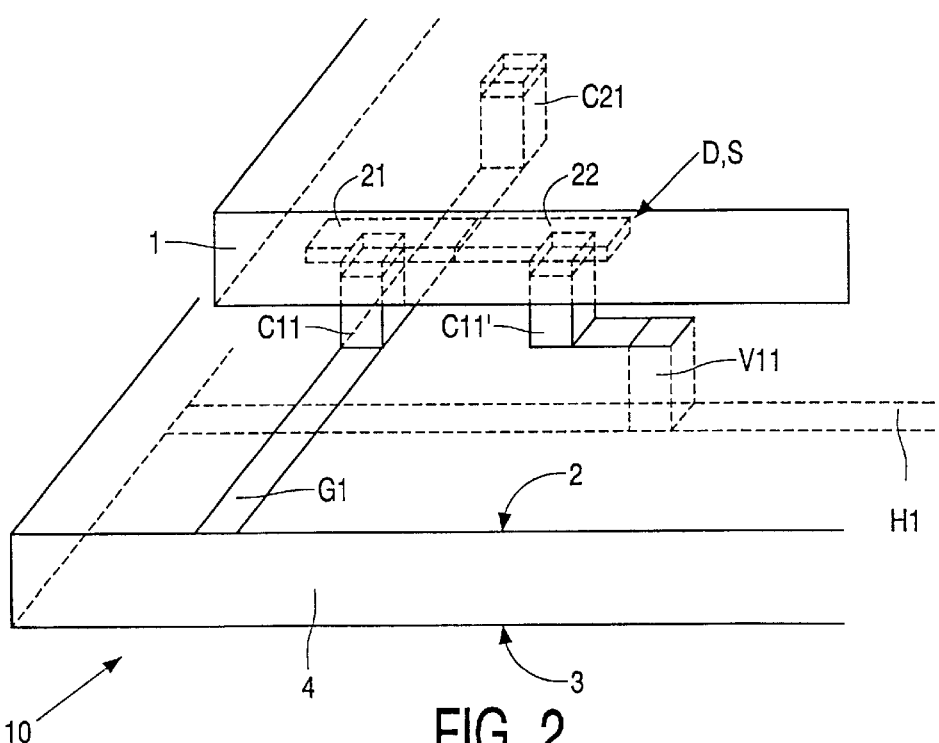
FIG. 2 is a diagrammatic, phantom view of a part of the device shown in FIG. 1 in a practical embodiment.

FIG. 1 is a diagrammatic, perspective view of a first example of a device in accordance with the invention, and FIG. 2 is a diagrammatic, phantom view of a part of the device, as shown in FIG. 1, in a practical embodiment. The device 10 comprises a series of contacts $C_{ij}$, in this case solder contacts $C_{ij}$, which are provided with connection conductors G, H for supplying electric current to the contacts $C_{ij}$ in order to test these contacts.

In accordance with the invention, the device 10 comprises a body 1, in this case a semiconductor body 1, on which the contacts $C_{ij}$ are situated in the form of an array, and the connection conductors G, H are provided with selection means S enabling maximally two contacts $C_{11}$, $C_{11}'$ to be selected, said connection conductors G, H being formed in maximally two separate metal layers 2, 3. Not only is the device 10 in accordance with the invention inexpensive and readily manufacturable, but it also enables a large number of contacts $C_{ij}$ to be tested. In the device 10 of this example, the selection means S are diodes D. These diodes are formed in the body 1, in this case a semiconductor body 1, from a p-type silicon region 21 and an n-type silicon region 22 (see FIG. 2). On one side 21, each diode D is connected, via a first contact $C_{11}$, to a first connection conductor G1 and, on a second side 22, each diode D is connected to a second connection conductor H1 via a second contact $C_{11}'$. The connection conductors G1, H1 form part of two groups of connection conductors $G_i$, $H_j$ which extend perpendicularly with respect to each other, but within these groups the conductors, $G_i$ and $H_i$ respectively, extend parallel to each other.

By virtue of the presence of diodes D, a large group of n×m contacts $C_{ij}$ can be tested by means of only n+m connection conductors $G_i$, $H_j$, since merely energizing the connection conductors G1, H1 enables the two contacts $C_{11}$ and $C_{11}'$ to be jointly (semi-)quantitatively tested. This can be attributed to the fact that a parasitic route for the electric current extending, for example, via the further connection conductors H2, G2 and through the contact pairs $C_{21}$, $C_{21}'$, $C_{22}$, $C_{22}'$ and $C_{12}$, $C_{12}'$ comprises three, or more generally an odd number, of diodes D one of which is oppositely directed with respect to the diode D of the contact pair $C_{11}$, $C_{11}'$. As a result, this parasitic path is blocked if the diode D associated with the contact pair $C_{11}$, $C_{11}'$ is forward biased, which should be the case when said pair is tested. The two groups $G_i$, $H_j$ of connection conductors $G_i$, $H_j$ are formed in two metal layers 2, 3 and are situated, in this example, on either side of a substrate 4, at the edge of which they are coupled, for example by means of clamping contacts, which are not shown in FIG. 2, to test equipment, not shown either in the drawing. The connection conductor H1 situated on the lower side of the substrate 4, is connected to the contact $C_{11}'$ by means of an electroconductive via V11. For simplicity's sake, FIG. 3 only shows the connection of the contact pair $C_{11}$, $C_{11}'$. The other contact pairs $C_{ij}$ are correspondingly formed and connected to the connection conductors $G_i$, $H_j$.

Figure 3:
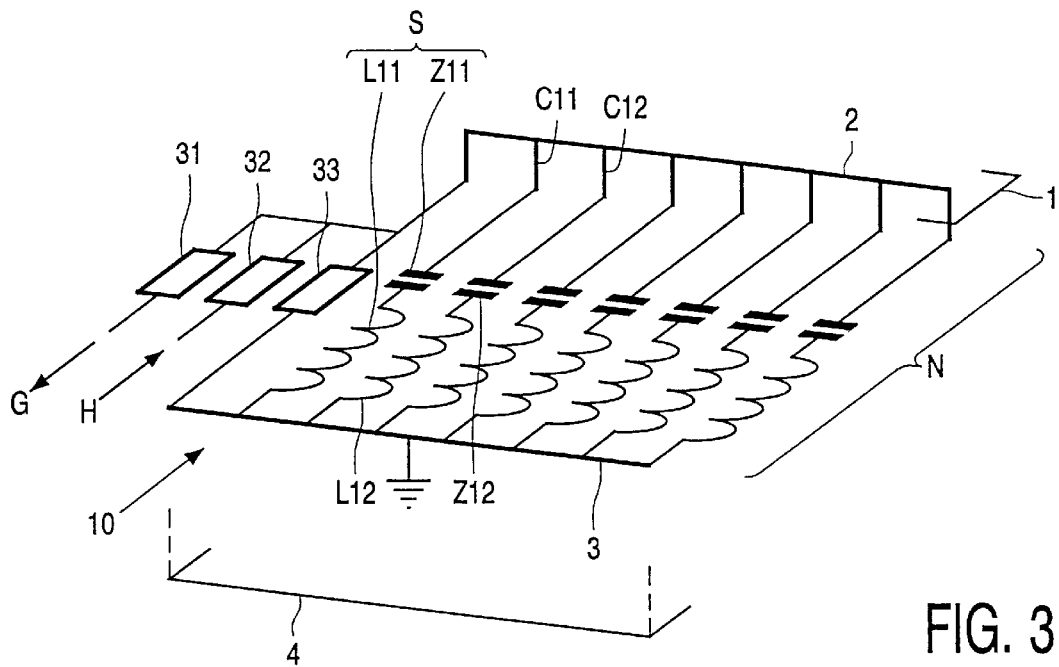
FIG. 3 is a diagrammatic, perspective view of a second example of a device in accordance with the invention.
Figure 4:
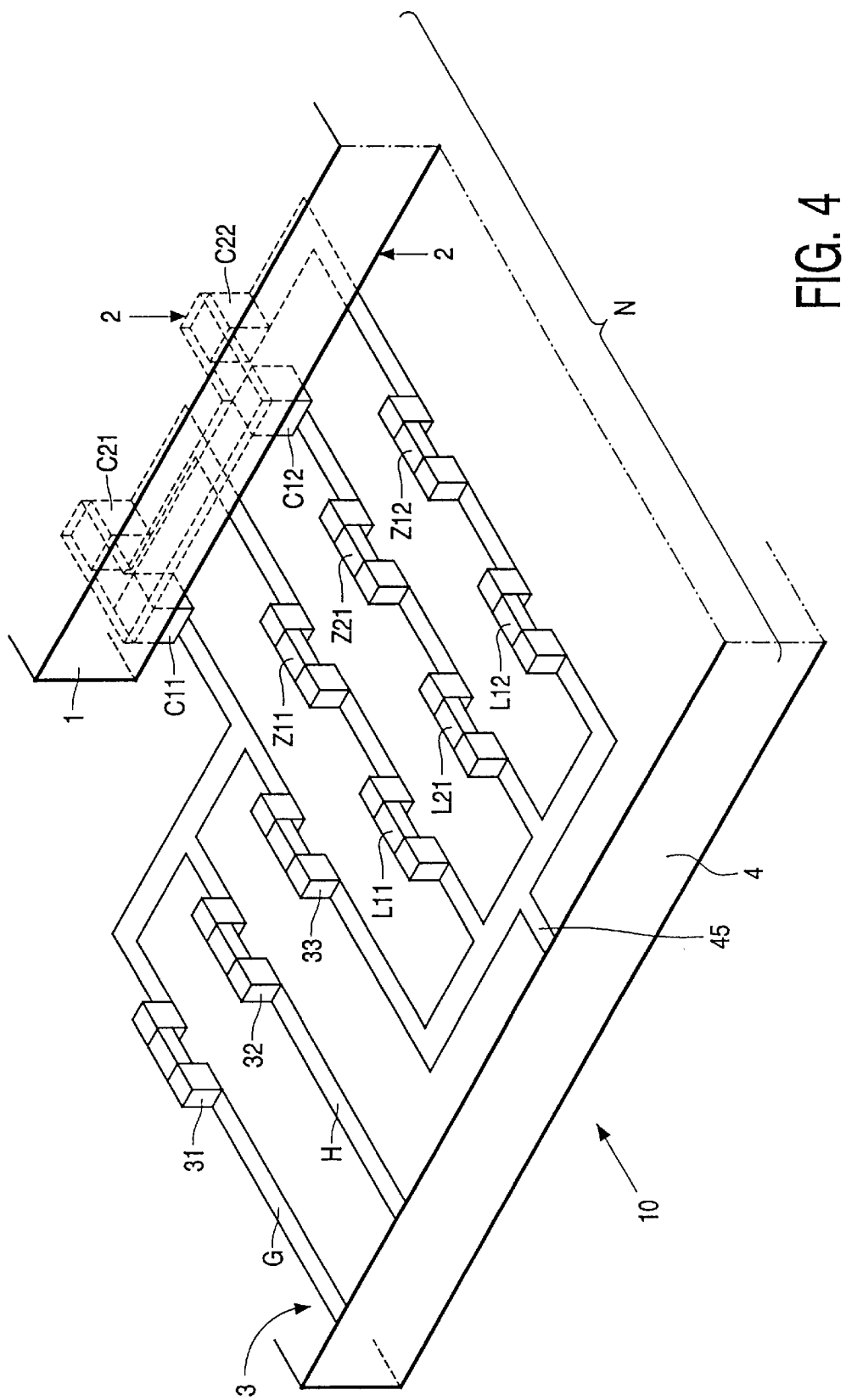
FIG. 4 shows, in a practical embodiment, a diagrammatic, phantom view of a part of a device resembling the device shown in FIG. 3.

FIG. 3 is a diagrammatic, perspective view of a second example of a device in accordance with the invention, and FIG. 4 is a diagrammatic, phantom view of a practical embodiment of a device resembling that shown in FIG. 3. In this example, all contacts $C_{ij}$ arranged on the body 1 are interconnected via a first metal layer 2 provided on the body 1. The contacts $C_{ij}$ are also incorporated in a network N forming a resonant circuit. A series arrangement of a capacitor $Z_{11}$ and a coil $L_{11}$, forming the selection means S in this example, is coupled to a contact $C_{11}$, said selection means enabling each individual contact $C_{ij}$ to be tested via no more than two metal layers 2, 3. The product $Z_{ij}*L_{ij}$ is chosen to be different for each contact $C_{ij}$, the differences, like in this example, preferably being at least approximately 20%. The network N is provided with two connection conductors G1, H1 accommodating, respectively, a resistor 31 of 47 Ohm and a further resistor 32 of 47 Ohm. The network N further comprises another resistor 33 (to ground) of 5.6 Ohm. The values of $Z_{11}$ and $L_{11}$ are, in this example, 680 pF and 330 nH, respectively. The values of $Z_{12}$ and $L_{12}$ are approximately 20% greater, and the values of $Z_{13}$ and $L_{13}$ are 20% as great again, etc. This results, for example, for an array of 7 contacts $C_{ij}$, in a $Z_{ij}$ of, respectively, 680, 470, 330, 220, 150, 100 and 68 pF, and a $L_{ij}$ of, respectively, 330, 220, 150, 100, 68, 47 and 33 nH. The respective resonance frequencies are 11, 16, 24, 36, 51, 75 and 110 MHz. Using the customary SMD components, frequencies in the range between 73 kHz and 6.7 GHz can be attained. The associated values for $Z_{ij}$ then range from 0.47 pF to 1 $\mu$F, and the associated values for $L_{ij}$ then range from 1.2 nH to 4.7 $\mu$H.

By virtue of the presence of the passive selection means S, in this case in the form of a series-arranged capacitor $Z_{ij}$ and coil $L_{ij}$, each contact $C_{ij}$ can be individually tested. In addition, this test is at least semi-quantitative, since variation of the (test) frequency will result in a signal SL comprising a spectrum wherein each individual contact forms a peak. The height of this peak is a semi-quantitative measure of the size of the impedance of the contact $C_{ij}$. The quality or the reliability of each pair of contacts $C_{ij}$, $C_{ij}'$ can thus be individually tested by monitoring over time under test conditions that can be varied.

FIG. 4 shows a practical embodiment of a device similar to that shown in FIG. 3. In this modification, unlike device 10 of FIG. 3, the contacts $C_{ij}$ are two-dimensionally arranged. The practical embodiment substantially corresponds to that of the first example. In this case, a first metal layer 2 is situated on the body 1 which is secured onto a substrate 4 via the contacts $C_{ij}$, which substrate is provided with a metal layer 3, only on a side 3 adjoining the body 1, forming the second metal layer 3 wherein the major part of the network N as well as the two connection conductors G, H are formed. The network N further comprises the components $Z_{ij}$, $L_{ij}$ and the contacts $C_{ij}$, which are incorporated in a conductor pattern. At the edge of the substrate 4, the connection conductors G, H are coupled, in the same manner as in the first example, to suitable test equipment, which is not shown in the drawing. At said location, a conductor track 45 of the network N is connected to ground.

Figure 5:
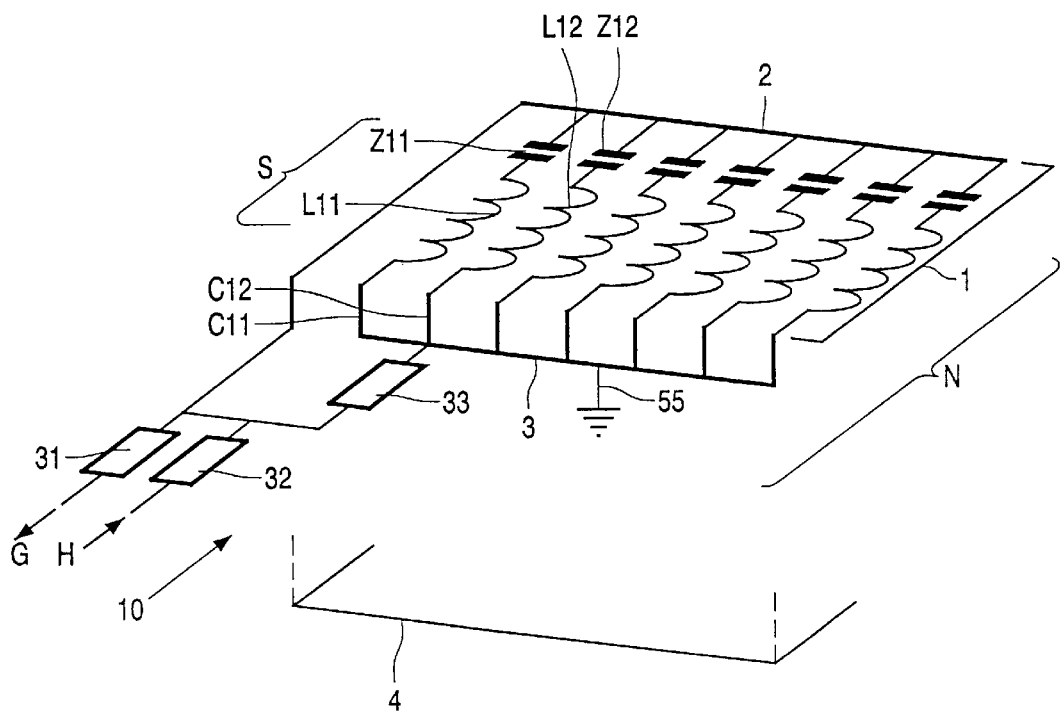
FIG. 5 is a diagrammatic, perspective view of a third example of a device in accordance with the invention.

FIG. 5 is a diagrammatic, perspective view of a third example of a device in accordance with the invention. The device 10 shown in this example is substantially the same as the device shown in the second example. For a more detailed description reference is made to said second example. The difference between this example and the second example resides in that the passive selection means S, which in this case too comprise a capacitor Zij and a coil Lij which are arranged in series, are integrated in the first metal layer 2 in the body 1. The second metal layer 3, which also in this case is situated on the upper side of a substrate 4, only comprises the connection conductors G, H and the conductor track 55 corresponding to conductor track 45. The advantage of the device 10 of this example resides in that this modification, wherein the passive components Lij, Zij are integrated in the (semiconductor) body 1 by means of (semiconductor) technology, can be more readily manufactured. All this means that, unlike the device shown in FIGS. 3 and 4, also the testing of contacts Cij is not clouded in this example by the testing of contacts by means of which the passive components Lij, Zij are provided. In this example, in the current state of the art, the possible values of Lij may be maximally 100 nH, while the values of Zij range between 0.1 and 31 pF.

The device 10 of each of the examples described hereinabove can be manufactured using customary techniques known within the semiconductor technology and the technology relating to substrates, such as printed circuit boards.

The invention is not limited to the examples described herein, and within the scope of the invention many modifications and variations are possible to those skilled in the art. For example, the contacts, which comprise soldered contacts in the examples described herein, may alternatively comprise other contacts such as an electroconductive glued joint or a clamping contact.

It is further to be noted that, particularly in the devices described in the second and the third example, the body does not necessarily have to be a semiconductor body. Use can also suitably be made of a printed circuit board or a ceramic board. The latter board can also be used as a substrate in the examples described hereinabove. Apart from a printed circuit board, use can also suitably be made in said cases of a flexible, electrically insulating foil provided on one or two sides with a conductor pattern and, if necessary, with vias. The same applies to the body described in the second and the third example.

What is claimed is:

1. A device (10) for testing a series of contacts (Cij), which are provided with connection conductors (G, H) for supplying an electric current to said contacts (Cij), characterized in that the device (10) comprises a body (1) on which the contacts (Cij) are situated in the form of an array (A), and the connection conductors (G, H) are provided with selection means (S) integrated in said body for enabling the selection of maximally two contacts (C11, C11'), and the connection conductors (C, H) are formed in maximally two separate metal layers (2, 3), wherein each contact (C11) in a network (N) is connected, on one side, to a first metal layer (2) and, on the other side, to a series-arranged inductance (L11) and capacitance (Z11), which are connected to a second metal layer (3), the network (N) being provided with two connection conductors (G1, H1).

2. A device (10) as claimed in claim 1, characterized in that the two metal layers (2, 3) are situated on either side of a substrate (4) on which the semiconductor body (1) is mounted, the first connection conductor (G1) being directly connected to the contact (C11) and the second connection conductor (H1) being connected to the neighboring contact (C11') by means of a via (V11).

3. A device (10) as claimed in claim 1, characterized in that the first metal layer (2) is situated on the body (2) attached to a substrate (4) on which the second metal layer (3) is situated in which the series-arranged inductance (L11) and capacitance (Z12) are housed and in which the two connection conductors (G1, H1) are formed.

4. A device (10) as claimed in claim 1, characterized in that the first metal layer (2) is situated on the body (1) attached to a substrate (4), and the series-arranged inductance (L11) and capacitance Z12) are accommodated therein, and the second metal layer (3) is situated on the substrate (4), and the two connection conductors (G1, H1) are formed therein.

5. A device (10) as claimed in claim 1, characterized in that the value of the product (L11*Z11) of each series-arranged inductance (L11) and capacitance (Z12) for each contact (C11) differs at least 20% from the value of the product (L12*Z12) for any other contact (C12).

6. A device as claimed in claim 1, characterized in that the contacts (Cij) are provided in the form of a two-dimensional array (A) on the body (1).

7. A device as claimed in claim 1, characterized in that the contacts (Cij) comprise a soldered joint (Cij).

* * * * *